United States Patent [19]

Ametani

[11] Patent Number: 5,159,202

[45] Date of Patent: Oct. 27, 1992

[54] WAFER SHAPE DETECTING METHOD

[75] Inventor: Minoru Ametani, Osaka, Japan

[73] Assignee: Nitto Denko Corporation, Osaka, Japan

[21] Appl. No.: 630,604

[22] Filed: Dec. 20, 1990

[30] Foreign Application Priority Data

Dec. 20, 1989 [JP] Japan ................................. 1-332388
Apr. 13, 1990 [JP] Japan ................................. 2-98899

[51] Int. Cl.⁵ .............................................. G01N 21/86
[52] U.S. Cl. ..................................... 250/561; 356/400
[58] Field of Search ............... 250/560, 561, 202, 548,
250/557; 318/577; 356/400, 401

[56] References Cited

U.S. PATENT DOCUMENTS

| 3,718,823 | 2/1973 | Niikura et al. | 250/561 |
| 4,238,780 | 12/1980 | Doemens | 250/561 |
| 4,752,696 | 6/1988 | Matsushita et al. | 250/561 |

Primary Examiner—David C. Nelms
Attorney, Agent, or Firm—Sughrue, Mion, Zinn, Macpeak & Seas

[57] ABSTRACT

An apparatus and method for detecting the shape of a circular, disk-like silicon wafer is disclosed in which both ends of a major orientation flat are detected by rotating the wafer at least one turn relative to the position of an optical sensor positioned slightly inside the wafer's outer circumference. The shape data thus obtained may be used to guide a cutting device to remove excess adhesive tape around the outer circumference of the wafer.

9 Claims, 7 Drawing Sheets

WAFER SHAPE DETECTING METHOD

The present invention relates to a wafer shape detecting method for detecting the contour of a thin-plate substrate (referred to hereafter as the "wafer") such as a semiconductor wafer and to a method of cutting an adhesive tape, which is applied to the wafer, along the outer circumference of the wafer by making use of the shape data thereof.

BACKGROUND OF THE INVENTION

In the process for fabricating a semiconductor, an adhesive tape is applied to a wafer, when the wafer back side is to be polished, so as to protect the wafer surface. In an adhesive tape cutting device to be used for such process, as disclosed in Japanese Patent Laid-Open No. 64-43458, there is applied to a positioned wafer an adhesive tape which is larger than the wafer. After this, the adhesive tape is cut along the outer circumference of the wafer to remove the portion protruding radially beyond the circumference of the wafer.

A silicon wafer generally has a disc shape, and a portion of its outer circumference is cut away straight, (called the "orientation flat" or "O.F."). In the aforementioned adhesive cutting device, as disclosed in Japanese Patent Laid-Open No. 61-254304, a wafer positioning method uses a roller to detect the O.F. of the wafer. After the wafer has been positioned with reference to the O.F., a cutting blade is linearly moved along the O.F. and then along the arcuate portion in the outer circumference of the wafer to cut away the adhesive tape along the outer circumference of the wafer.

However, the devices thus constructed have the following problems.

Specifically, some wafers are formed with not only a first O.F. with a larger notch, but also second and third O.F.s with smaller notches. Another wafer may be chipped partially in its outer circumference. When it is intended to cut the adhesive tape applied to such a wafer, what is detected by the wafer positioning method described above is only the first O.F., but not the wafer contour such as other O.F.s or chips. When a cutting blade is moved along the wafer circumference to cut the adhesive tape, there arise problems that the inertia of the cutting blade leaves the adhesive tape uncut at the second and/or third O.F.s, and the cutting blade cuts into the chipped portion so that the blade itself and/or the 15 wafer are broken.

If the wafer has a varying outer diameter, on the other hand, the conventional method using the roller fails to catch the center position of the wafer. When the O.F. is to be adjusted to some reference, the conventional devices are difficult to adjust.

In addition, the optical sensor used in these devices has a wide luminous flux, so the method of using the optical sensor is not reliable for the detection when the portion of the wafer to be detected is slightly notched.

If, in this case, the center of the wafer is eccentric to the center of rotation, the problem of the devices' inability to recognize the notch or the eccentricity is left unsolved by using a sensor having a thin optical axis.

SUMMARY OF THE INVENTION

The present invention has been conceived in view of the circumstances thus far described and has an object to provide a wafer shape detecting method capable of detecting the contour of the wafer relatively easily and a method capable of positioning by recognizing the contour of the wafer accurately even if the wafer is more or less eccentric.

In order to achieve the above-specified object, the present invention takes the following structure.

DETAILED DESCRIPTION OF THE INVENTION

According to the present invention, a first wafer shape detecting method comprises detecting both ends of a major orientation flat in a wafer by relatively displacing an optical sensor, which is disposed slightly inside of the arcuate portion of the outer circumference of said wafer, along the outer circumference of said wafer. The method involves setting the reference position of said wafer on the basis of the positions of said both ends; and sampling the shape data of said wafer in correspondence to the data of angle of rotation from said reference positions by relatively displacing said optical sensor and said wafer at least one turn from the start point of said reference position.

The operation is as follows.

By relatively displacing the optical sensor, which is positioned slightly inside of the arcuate portion of the outer circumference of the wafer, the optical sensor is turned ON/OFF in accordance with the size of a plurality of orientation flats or chips formed in the outer circumference of said wafer. Since the major orientation flat in the wafer is larger than the others, its two end positions are detected from the duration of the ON (or OFF) period of the optical sensor. On the basis of these two end positions, a reference position of the wafer is set. By using this reference position, moreover, the optical sensor and the wafer are relatively rotated at least one turn so that the contour data of the wafer is sampled by introducing the detected signal of the optical sensor corresponding to the data angle of rotation, at that time.

The embodiments of the present invention is described in detail in reference to the accompanying drawings.

Figure 1:
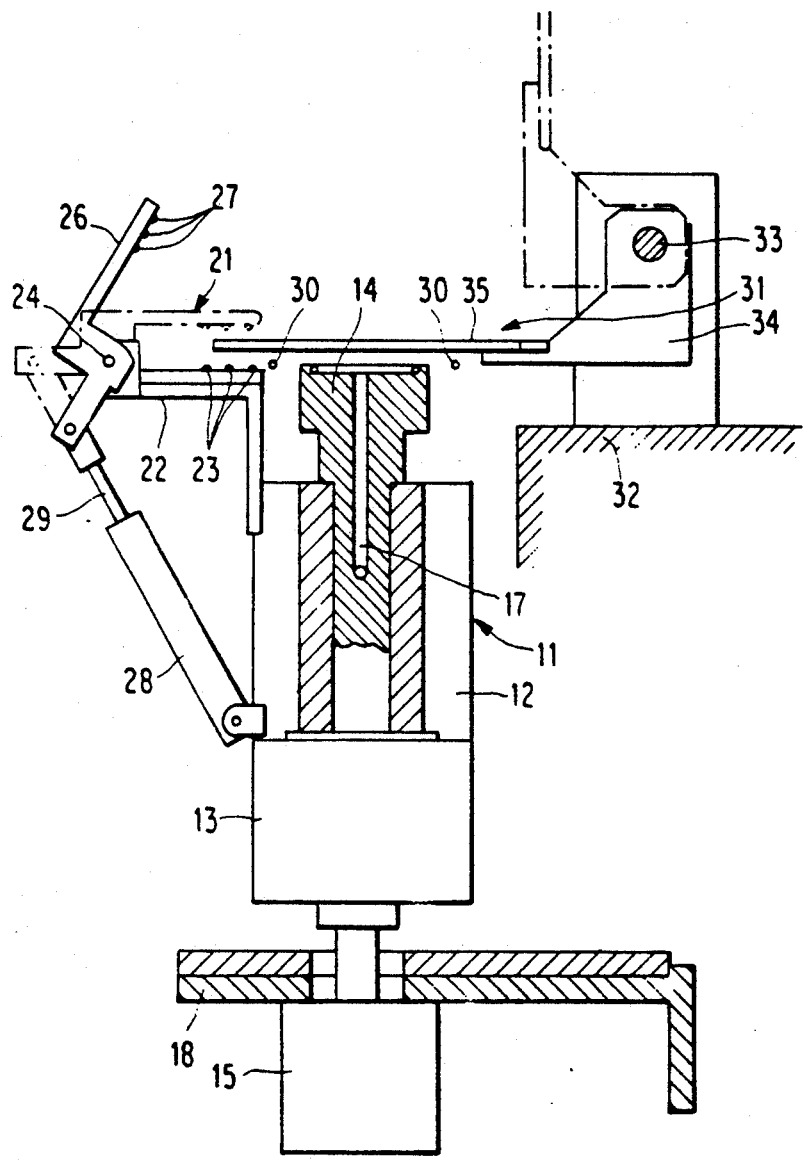
FIG. 1 is a partially broken front elevation showing the schematic structure of the apparatus to be used for detecting the shape of the wafer.
Figure 2:
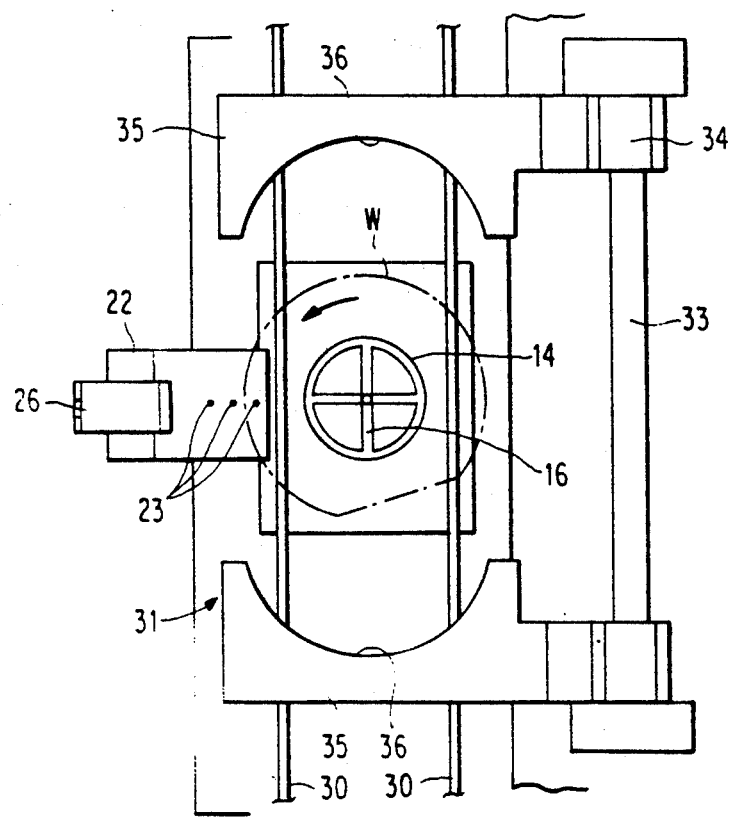
FIG. 2 is a top plan view of the apparatus shown in FIG. 1.

FIGS. 1 and 2 show one embodiment of the apparatus for executing the wafer shape detecting method according to the present invention.

Swivel means 11 for turning a wafer W is constructed of: a suction bed 14 which articulates in a lift frame 12. A step motor 13 rotates the suction bed 14. A lifting air cylinder 15 15 moves the lift frame 12 up and down together with the step motor 13. The air cylinder 15 is attached to a stationary (or movable, if necessary) frame 18.

The suction bed 14 is formed in its top face with suction channels 16, as shown in FIG. 2, which are connected to a communication conduit 17 of FIG. 1 communicating with the evacuating suction device (not shown).

Detection means 21 for detecting the circumferential portion of the wafer W is equipped with a plurality of optical sensors 23 which are carried by a bracket 22 fixed to the upper end of the lift frame 12. These optical sensors 23 are arranged on an extension of the center line of the suction bed 14 and in a lower position than the top face of the suction bed 14 in its lifted position. The reason why the optical sensors 23 are provided in plurality is to make it possible to position wafers W of different sizes. Each of the individual optical sensors is arranged slightly inside of the outer circumference of the arcuate portion of the corresponding wafer W.

To the outer end of the bracket 22, there is hinged, by means of a pin 24, a cover plate 26 which can be swung up and down. To the lower face of this cover plate 26, there are attached a plurality of light projectors 27 for emitting optical beams to the individual optical sensors 23.

To the lower end of the lift frame 12, there is hinged, in a rocking manner, an air cylinder 28 having an upper end, from which projects a piston rod 29. Piston rod 29 is connected to the cover plate 26 so that the cover plate 26 is driven by the forward and backward movement of the piston rod 29.

A pair of right and left conveyer belts 30 for conveying the wafer W are positioned at a slightly higher level than the top face of the suction bed 14 in the lowered position and at the top sides of the suction bed 14.

Centering means 31 is constructed by supporting a guide shaft 33 on a bearing mounted in a mount 32 and by removably attaching a centering plate 35 to a pair of arms 34 fitted in a sliding or rocking manner on the guide shaft 33. Each of the center plates 35 is formed with an arcuate recess 36.

Recess 36 is formed to have a contour profiling the circumference of the wafer W. The individual arms 34 are opened or closed by the link mechanism (not shown) so that their recesses 36 are brought, when closed, into contact with the outer circumference of the wafer W to move it into a position concentric to the suction bed 14. Moreover, the arms 34 can be raised from the position indicated by solid lines in FIG. 1 to the position indicated by broken lines by the action of the erecting means (not shown). The aforementioned centering plates 35 can be replaced by other plates having recesses 36 which are sized to correspond to the size of a wafer W to be processed.

The operation of the apparatus thus constructed is described as follows.

The wafer W is conveyed onto the suction bed 14 by the carrier belts 30 under conditions, in which the top face of the suction bed 14 is below the conveyer belts 30, as shown in FIG. 1, in which the cover plate 26 is raised to the position, as indicated by the solid lines in FIG. 1, and in which the arms are raised and opened, as indicated by the broken lines in FIG. 1. If suitable detecting means detect that the wafer W has arrived on the suction bed 14, the conveyer belts 30 are stopped, and then the air cylinder 15 act to lift the lift frame 12 to transfer the wafer W from the conveyer belts 30 onto the suction bed 14.

The arms 34 are swung on the guide shaft 33 to bring the centering plates into the horizontal positions, and the wafer W and the centering plates 35 lie on a coextensive plane. This state is shown in FIG. 2, in which the centering plates 35 are apart from the wafer W.

When the individual centering plates 35 come into the horizontal positions, as described above, they begin to close. When the recesses 36 of the centering plates 35 come to the outer circumference of the wafer W, the wafer W has its center aligned with the center of rotation of the suction bed 14.

In this state, the evacuation of the suction bed 14 is started. When the wafer W is sucked and held onto the suction bed 14, the two arms 34 are opened to cause their centering plates 35 to move away from the wafer W until they are directed upward, as indicated by the broken lines in FIG. 1.

When the arms 34 are thus directed upward, the cover plate 26 is turned downward until it is stopped in the position, as indicated by the broken lines in FIG. 1. Where the wafer W has its smallest diameter, as shown, the optical beam is emitted from the innermost projector 27 to the innermost optical sensor 23. Simultaneously with this, the step motor 13 is driven in the direction of arrow, FIG. 2, to effect the detection of the O.F. The positioning and the sampling of the shape data of the wafer W is described as follows.

Before entering into the specific description of the detecting operations, the schematic structure of the control system for the detecting operations of the present apparatus is first described with reference to FIG. 3.

Figure 3:
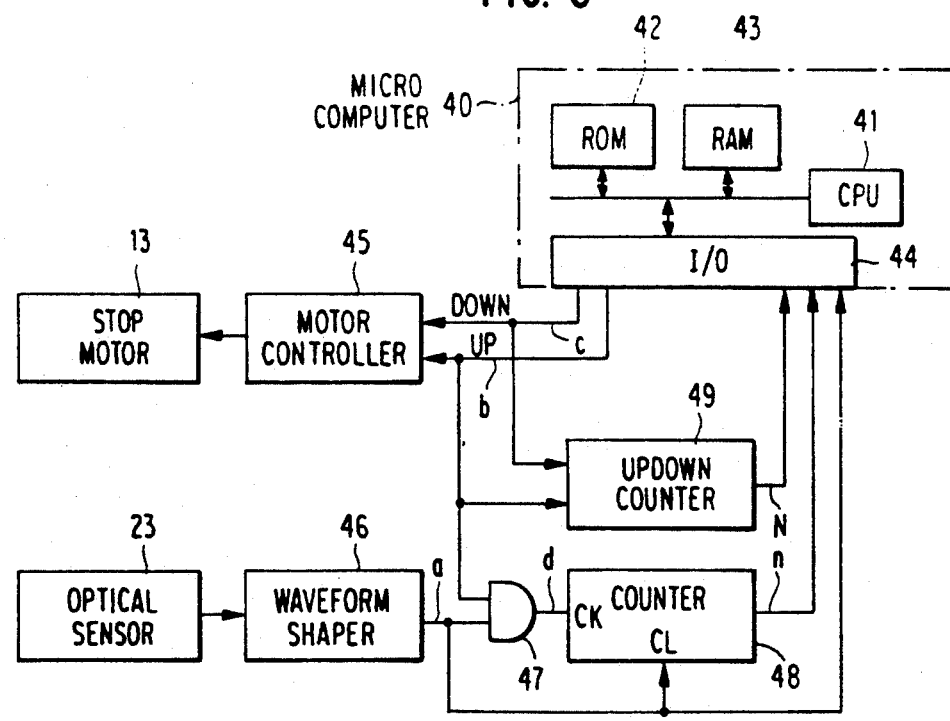
FIG. 3 is a schematic block diagram of a control system for detecting the shape of the wafer.

In FIG. 3, reference numeral 40 designates a microcomputer which is composed of a CPU 41, a ROM stored with the processing program, a RAM for storing the sampled shape data, and an input/output interface 44. A motor controller 45 for effecting rotation of the step motor 13 through an angle corresponding to the number of pulses fed from the microcomputer 40. Numeral 46 designates a waveform shaper for shaping the waveform of the detected signal of the optical sensor 23. The output of the waveform shaper 46 is fed as a gate control signal to an AND gate 47. UP pulses (i.e., pulses for rotating the step motor 13 counter-clockwise) are fed as the other input of the AND gate 47 from the microcomputer 40. On the other hand, a counter 48 counts the number of pulses having passed through the AND gate 47, and an updown counter 49 which is fed from the microcomputer 40 with the UP pulses and DOWN pulses (i.e., pulses for rotating the step motor 13 clockwise).

Figure 4:
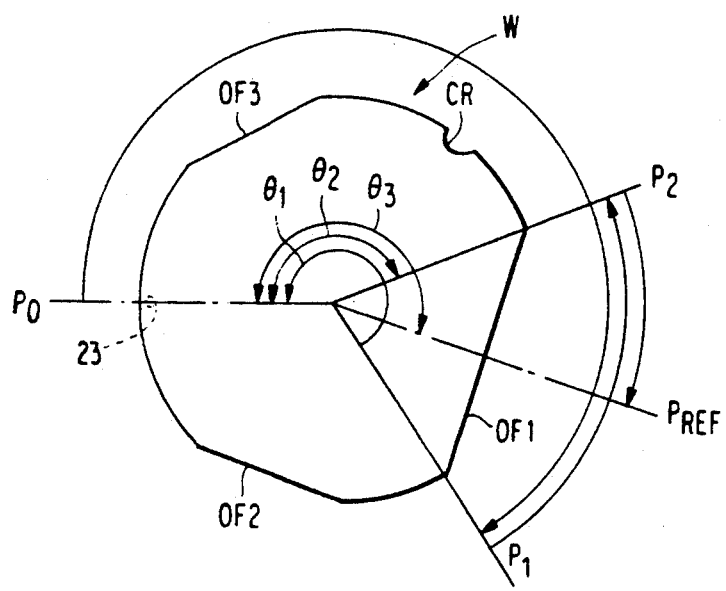
FIG. 4 is a top plan view of the wafer.

The detection of the wafer W, as shown in FIG. 4, occurs as follows. In FIG. 4: reference characters OF1 designate the first (or major) O.F. which is the largest in the wafer W; characters OF2 and OF3 designate second and third O.F.s smaller than the first O.F. OF1; and letters CR designate a chipped portion of the wafer.

It is assumed that the wafer W and the optical sensor 23 are in the positional relationship, as shown in FIG. 4, at the initial stage in which the wafer W is mounted on the suction bed 14, after the aforementioned centering action of the centering means 31.

Figure 5:
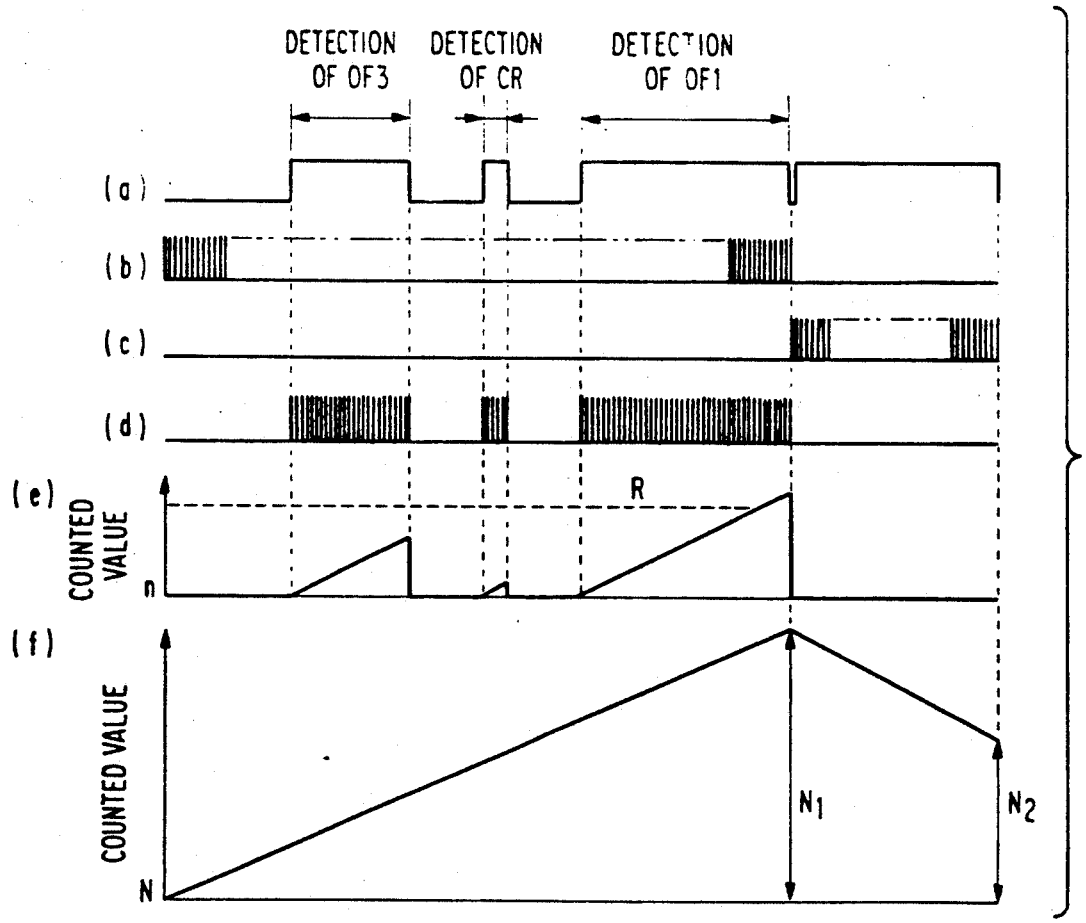
FIGS. 5(a)–5(f) are waveform charts of the detecting operation.

If the wafer W is rotated counter-clockwise from that stage by the UP pulses outputted from the microcomputer 40, the optical sensor 23 detects the notch in the outer circumference of that wafer W. Then, a detection signal a, FIG. 5(a), is outputted from the waveform shaper 46. The optical sensor 23 is ON while it is detecting the notch of the wafer W.

Meanwhile, UP pulses b, as shown in FIG. 5(b), are inputted to the AND gate 47, FIG. 3. Then, AND gate 47 has its gate controlled by the aforementioned detection signal a so that it outputs a pulse signal d, as shown in FIG. 5(d). The counter 48 counts the number of the pulse signals d and outputs its counted value n to the microcomputer 40. Incidentally, the counted value n of the counter 48 is cleared with the break of the detection signal a, as schematically shown in FIG. 5(e).

Figure 6:
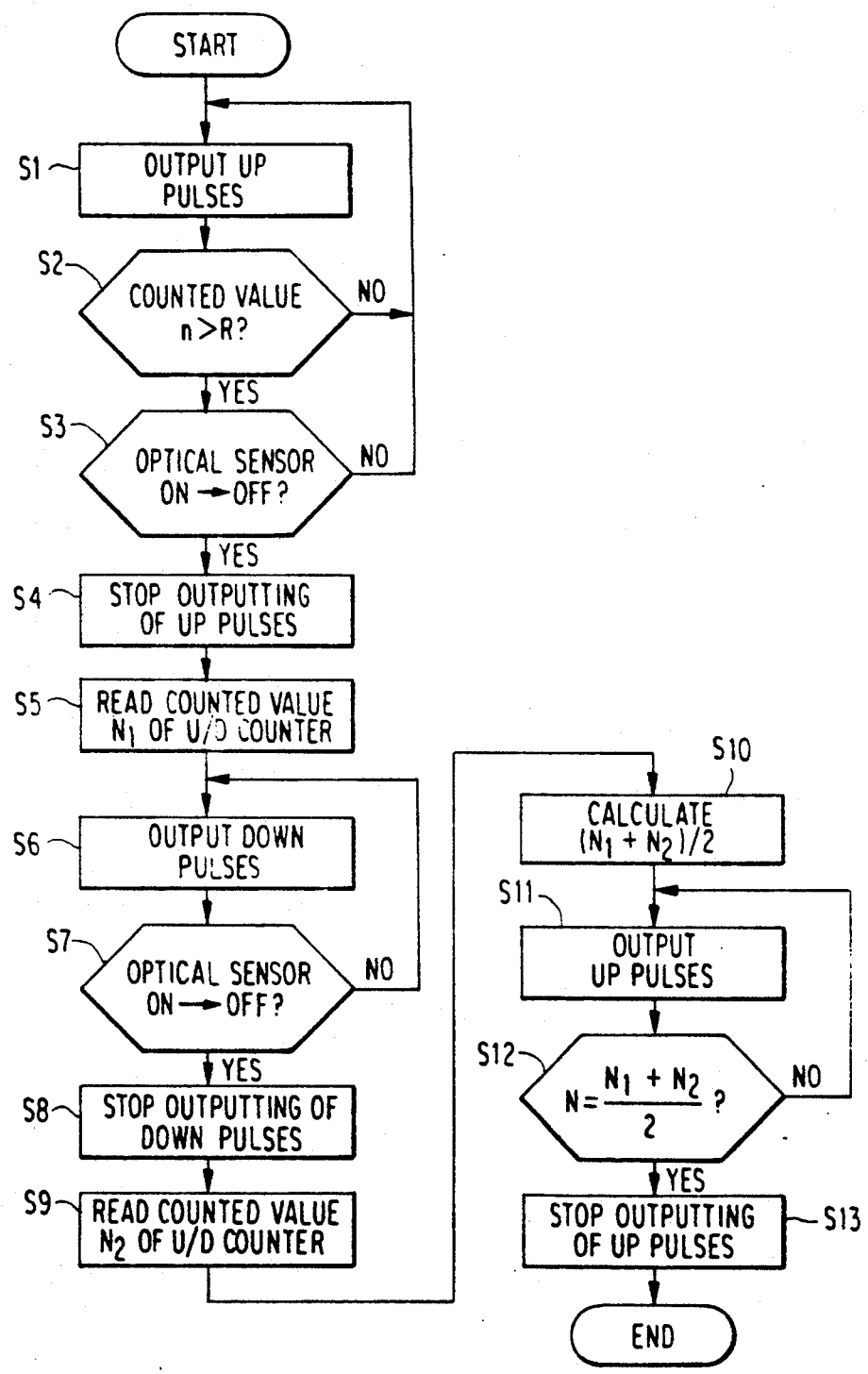
FIG. 6 is a flow chart of the routine for detecting the first O.F. of the wafer.

As shown in the flow chart of FIG. 6, the microcomputer 40 monitors (at Steps S1 and S2) whether or not the counted value n of the counter 48 exceeds a predetermined reference number R, each time it outputs the UP pulses b. This reference number R is a constant which is predetermined in accordance with the size of the first O.F. (OF1) of the wafer W. While the counted value n is smaller than the reference number R, the microcomputer 40 decides that the first O.F. (OF1) is not yet detected, and continues to output the UP pulses b.

When the counted value n exceeds the reference number R, the microcomputer 40 decides that the notch detected at this time by the optical sensor 23 is the first O.F. (OF1). Then, the routine advances from Step 2 to Step 3, and the UP pulses b are continuously outputted till the detection signal a of the optical sensor 23 is switched from the On state to the OFF state.

When the optical sensor 23 is turned OFF, the microcomputer 40 stops outputting the UP pulses b and reads and stores (at Steps S4 and S5) the counted value N1, FIG. 4 of the updown counter 49 in the RAM 43. As shown in FIG. 4, the counted value $N_1$ corresponds to an angle $\theta_1$ from an initial position $P_0$ to one end $P_1$ of the first O.F. (OF1).

Next, DOWN pulses c are outputted (at Step S6), FIG. 5(c), to rotate the wafer W in the reverse direction. In accordance with this, the counted value N of the updown counter 49 is decreased, FIG. 5(f). Each time the microcomputer 40 outputs one DOWN pulse c, it monitors whether or not the detection signal a of the optical sensor 23 is switched from the ON state to the OFF state. If in the OFF state (at Step 7), the microcomputer 40 stops (at Step S8) the outputting of the DOWN pulses c and reads (at Step S9) the counted value $N_2$ of the updown counter 49, at that time, to store it in the RAM 43. The counted value $N_2$ corresponds to an angle $\theta_2$ from the initial position $P_0$ to the other end $P_2$ of the first O.F. (OF1).

Incidentally, the detections of the two ends $P_1$ and $P_2$ of the first O.F. (OF1) can be accomplished by rotating the wafer W in the same direction. Specifically, the two ends of the first O.F. (OF1) can be detected by detecting the instant when the optical sensor 23 is switched from the OFF state to the 0 state and then the instant when the optical sensor 23 is switched from the ON state to the OFF state. However, these detections may be followed by errors due to the difference in the response times of ON→OFF and OFF→ON of the optical sensor 23. If, therefore, the two ends of the first O.F. (OF1) are detected by reversing the turning direction of the wafer W, as in the present embodiment, to make detection possible, switching ON-OFF of the optical sensor 23 is required so that detection accuracy can be enhanced.

Next, the CPU 41 reads the counted values $N_1$ and $N_2$ stored in the RAM 43 and executes (at Step 10) the calculation of $(N_1+N_2)/2$. This calculation result corresponds to an angle $\theta_3$ from the initial position $P_0$ to an intermediate position $P_{REF}$ is determined, the microcomputer 40 outputs (at Step 11) the UP pulses to drive the wafer W rotationally. When the counted value of the updown counter 49 takes $(N_1+N_2)/2$ (at step S12), the microcomputer 40 stops (at Step S13) the outputting the UP pulses. As a result, the reference position $P_{REF}$ of the wafer W is at the initial position $P_0$ where the optical sensor 23 is placed.

Figure 7:
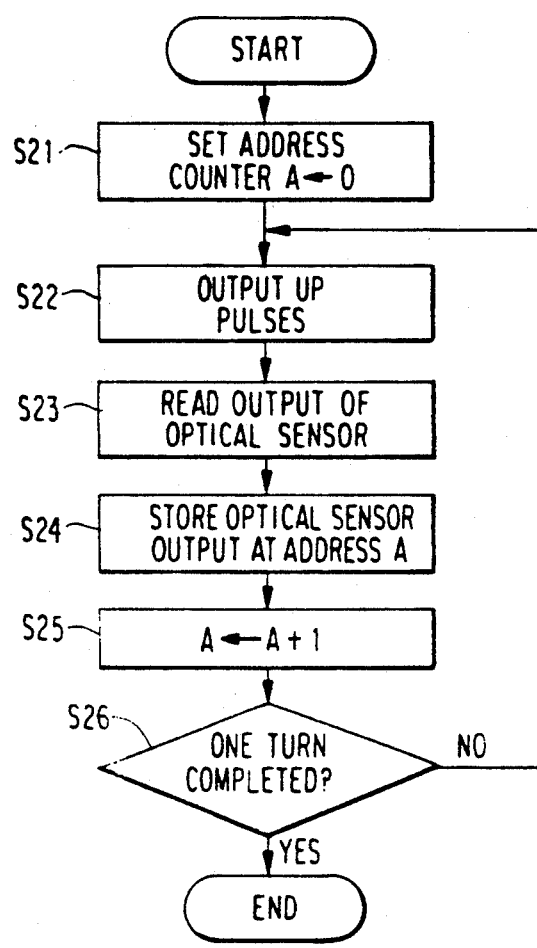
FIG. 7 is a flow chart of the routine for sampling the shape data.

Next, the reading of the contour of the wafer by reference to the reference position $P_{REF}$ is described as follows, with reference to FIG. 7.

Figure 8:
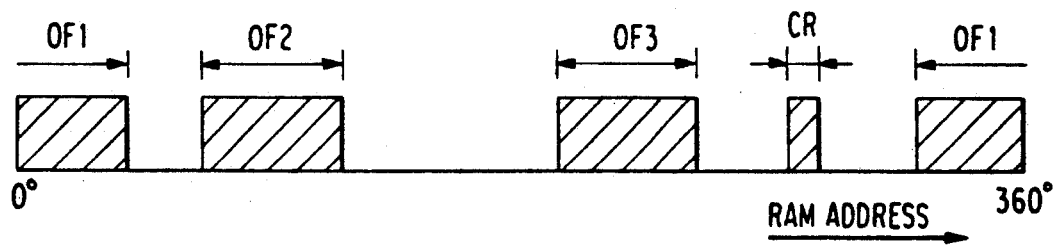
FIG. 8 is a schematic diagram of the sampled shape data.

When the positioning of the reference position $P_{REF}$ is ended, the counted value (referred to as the "address") A of the shape data writing address counter (not shown) disposed in the microcomputer 40 is set to "0" (at Step S21), and the UP pulses are outputted (at Step S22). Each time the UP pulses are outputted, the detection signal of the optical sensor 23 is read (at Step 23) and written at the address A of the RAM 43 (at Step S24). Next, the address A is counted up (at Step S25), and it is decided (at Step S26) whether or not the wafer W has been rotated one turn. If the wafer W is not rotated one turn, the routine is returned to Step S22, and the subsequent UP pulses are outputted so that the shape data ar likewise sampled. By thus rotating the wafer W one turn from the reference position $R_{REF}$, the shape data of the wafer W are so stored in the RAM 43 as to correspond to the angle data of rotation (i.e., the RAM address A), as schematically shown in FIG. 8.

In case, in the embodiment thus far described, the counted value n of the counter 48 exceeds the reference number R, the notch at this time is determined to be the first O.F. (OF1). Alternatively, first and second reference numbers may be set according to the size of the first O.F. (OF1) so that the notch may be decided to be the first O.F. (OF1) if the counted value n of the counter 48 is between the two reference numbers.

By making use of the shape data obtained according to the present invention, moreover, the moving speed or edge angle of the cutting blade in the adhesive tape cutting device, for example, can be properly controlled in accordance with the contour of the wafer. As a result, the adhesive tape can be accurately cut along the outer circumference of even a wafer formed with a plurality of orientation flat portions of the circumference of said wafer.

A second wafer shape detecting method according to the present invention involves a swivel means for turning a wafer and an optical means including a sensor and an emitter; for detecting a portion in the outer circumference of said wafer to be turned by said swivel means. The optical sensor is adapted to receive a linear luminous flux having a constant length in a plane perpendicular to said wafer along a radius of said wafer and extending outwardly beyond the outer circumference; of said wafer. The shape of the outer circumference of said wafer is recognized in terms of the change in the amount of flux passing the circumference of the disk and being received by said optical sensor while turning said wafer by; so, the contour of said wafer may be recognized by the shape data of the change in the line segment which is generated by said optical sensing device.

Figure 9:
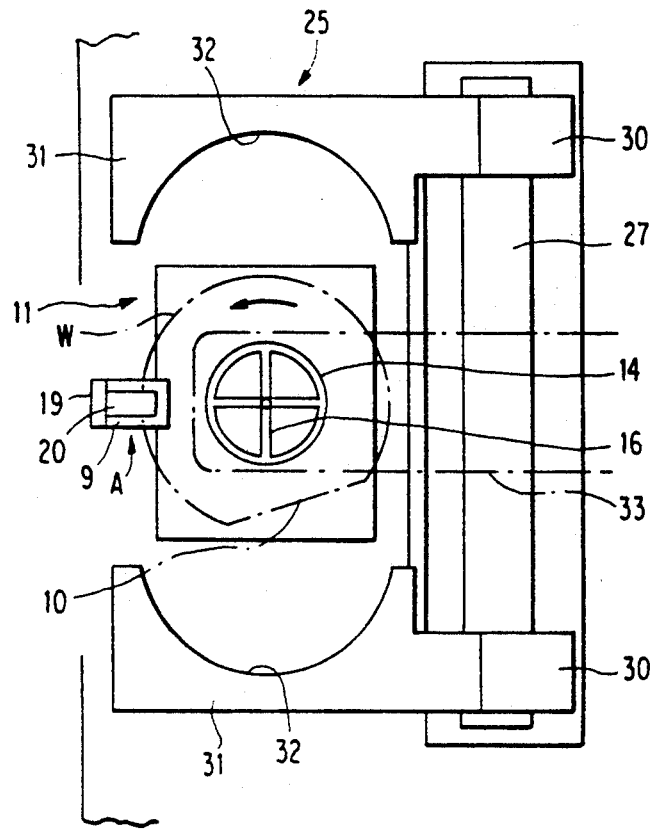
FIG. 9 is a top plan view showing the apparatus for carrying out the present invention.
Figure 10:
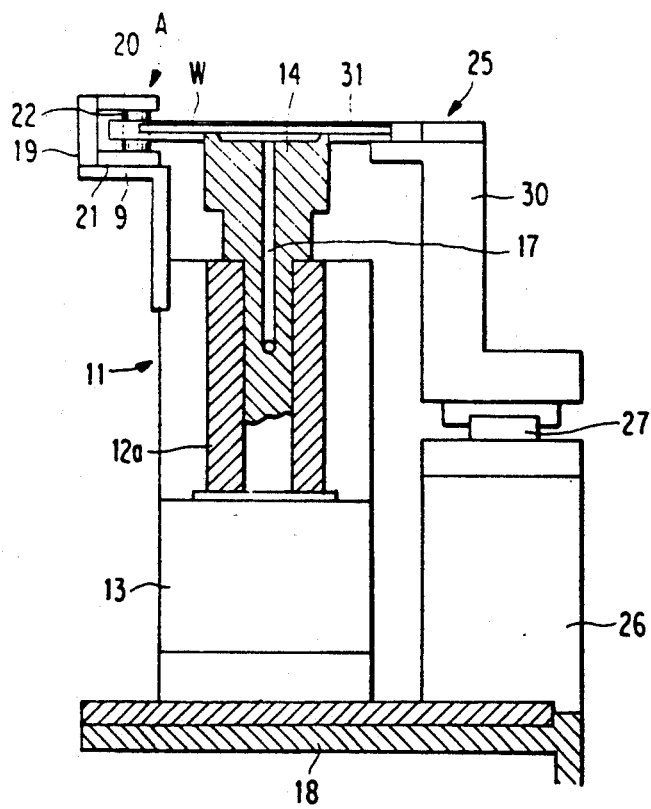
FIG. 10 is a longitudinally sectional front elevation of the same.
Figure 11:
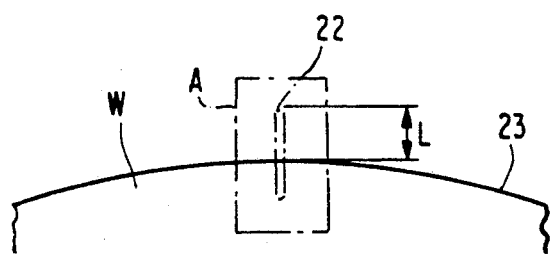
FIG. 11 is an enlarged top plan view showing an essential portion.

FIGS. 9 to 11 show one embodiment of the apparatus for carrying out the method of the present invention. In FIG. 10, swivel means 11 is constructed of: a suction bed 14 rotating in a bearing 12a; a step motor 13 for rotating the bed 14; and a stationary frame 18 fixing the bearing 12a together with the motor 13.

The suction bed 14 is formed in its top face with suction channels 16, as shown in FIG. 9, which are connected with a communication conduit 17, FIG. 10, communicating with the evacuating suction device (not-shown).

A bracket 9 is fixed to the upper end of the aforementioned bearing 12a. On this bracket 9, there is fixed a vertical plat 19, as shown in FIG. 10, to which an optical sensor A is attached.

This optical sensor A is composed of a light projector 20 and a photoelectric element 21, which are fixed on each of the top and bottom faces, respectively, of the support plate 19. The optical sensor A emits a thin linear luminous flux 22 at right angles to the pane of the wafer radially inward toward the center of a wafer W, of constant radial length.

The optical sensor A is positioned to irradiate a constant region of the outer circumference of the wafer 6 with the luminous flux.

In FIGS. 9 and 10, centering means 25 are constructed by mounting a guide rail 27 on a mount 26, and by attaching centering plates 31 removably by means of screws to a pair of upright arms 30, which in turn are mounted on the guide rail 27 in a sliding or rocking manner. The centering plates 31 are formed with arcuate recesses 32 facing each other, as shown in FIG. 9.

The arcuate recesses 32 are sized to profile the circumference of the wafer W. The arms 30 are opened or closed by the link mechanism (not-shown), which cause the recesses 32 to form such a circle, when closed, as profiles the outer circumference of the wafer 6 and is concentric with the suction bed 14.

The wafer W is held by a suction plate 33 on arbitrary conveyer means (now shown), and moved to a position above the centering means 25, as indicated by the broken lines in FIG. 9.

Since, at this time, the centering plates 31 are opened wide, as indicated by solid lines in FIG. 9, the wafer W held above the suction bed 14 without any contact with the plates 31.

It is detected by some means that the wafer W fed to the top of suction bed 14 has its center generally at the center of rotation of the suction bed 14, the suction plate 33 is then moved slightly down to place the wafer 6 on the suction bed 14, and suction is then released.

Next, the individual centering plates 31 start to close, bringing their recesses 32 into control with the outer circumference of the wafer W. Then, the wafer W has its center aligned with the center of rotation of the suction bed 14.

Simultaneously with this, the evacuation of the suction bed 14 is started, which fixes wafer W on the suction bed 14. At the same time the two arms 30 are opened, and move their centering plates 31 apart from the wafer W.

Next, the luminous flux is projected from the projector 20 to the photoelectric element 21. Simultaneously with this, the step motor 13 is started by the pulse signal coming from the motor controlling pulse generator, which rotates the suction bed 14 in the direction of arrow (FIG. 9).

The luminous flux 22 projected from the projector 20 irradiates an arbitrary range of the outer circumference of the wafer W. The optical beam, having a radial length L extending from the circumferential edge 23 (FIG. 11) to he outer end of the luminous flux 22, illuminates the photoelectric element 21 so that a voltage corresponding to the amount of illumination is sent to the detection circuit.

Figure 12:
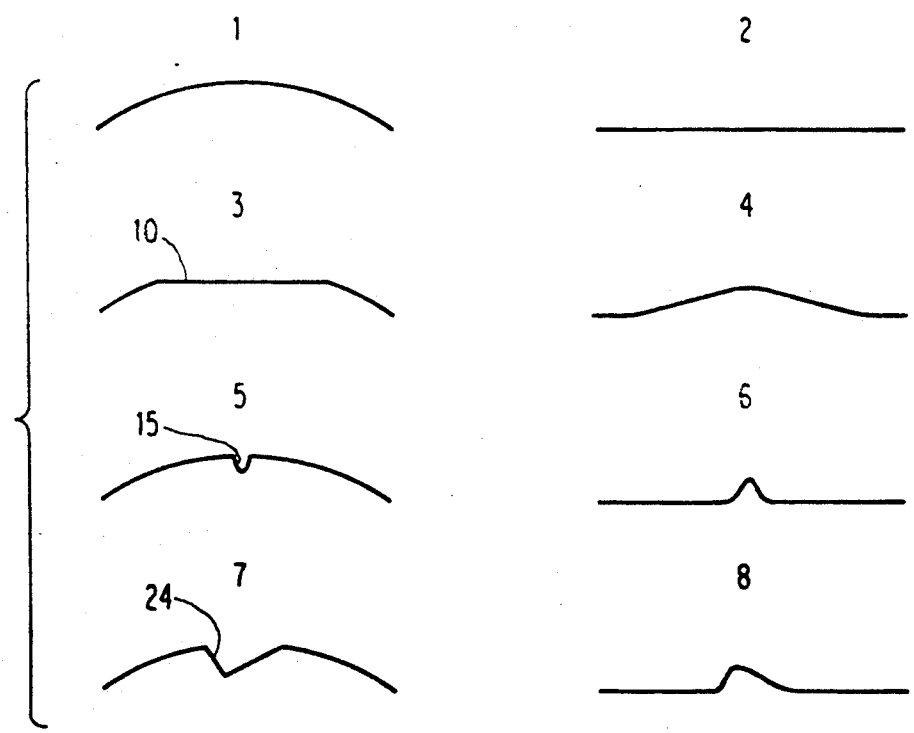
FIG. 12 presents at I to VIII top plan views and waveform charts for explaining the operations of the same.

In case, therefore, the circumferential edge 23 passing the line of luminous flux 22 forms part of the circumference concentric with the center of rotation, as shown at I in FIG. 12, the voltage being monitored by the detection circuit has a constant level (II in FIG. 12). If the portion of the O.F. 10 passes a portion of the luminous flux 22, (III in FIG. 12), a symmetric gentle rise is formed, which forms a peak when the center of the O.F. 10 passes the luminous flux 22 at (IV in FIG. 12).

If a notch 15 (V in FIG. 12), passes the luminous flux 22, the waveform forms a sharp peak (VI in FIG. 12). If an irregular chip 24 (VII in FIG. 12), passes the luminous flux, the waveform takes an accordingly irregular shape (VIII in FIG. 12).

As a result, the position and size of the O.F. 10 or a notch can be evaluated to position the wafer, or to find defective wafers by monitoring the fluctuating voltage level and by collating it with the rotational data of the step motor 13.

The aforementioned embodiment uses the step motor, which can be replaced by a DC servomotor if it is used with an encoder for transmitting the angle of rotation of the servomotor as a pulse signal.

According to the present invention, the projector of the optical sensor emits a thin linear luminous flux of constant length radially inward toward the center of the wafer and thereby irradiates the constant radial region of the outer circumference edge of the rotating wafer, when the portion to be detected, such as the O.F. or notch formed in the circumferential edge of the wafer, is to be detected by the photoelectric element of optical sensor A. As a result, the shape of the outer circumferential edge of the wafer can be accurately recognized without any contact with the circumferential edge of the wafer by monitoring the voltage outputted from the photoelectric element 21 while rotating the wafer.

Thus, the wafer can be positioned by recognizing its O.F. or notch. Using this technique, no error is caused even if the center of the circle formed of the outer circumference of the wafer is more or less offset from the center of rotation of the wafer.

Since the shape of the outer circumference of the wafer can be recognized, moreover, the present invention can also be applied to discover a wafer having a defective outer circumference or to detect a wafer which is not disk-shaped.

As has been described hereinbefore, according to the present invention, a tape applied to the surface of a wafer can be cut into an arcuate shape by guiding the blade based on the wafer shape data detected. Moreover, the circumferential portion can be linearly cut by imparting linear movements to the blade. By discriminating the position or size of the notch, the error, if any, in the shape of the wafer can be detected. The blade then may be stopped or the data stored to send a message to the apparatus for effecting a subsequent method step.

Real time processing can be achieved by assembling the aforementioned detecting method and the processing or cutting means in a common machine. As a result, even wafers (or works) of different shapes can be automatically processed (without any modification).

What is claimed is:

1. A wafer shape method comprising the steps of:
   (a) detecting both ends of a major orientation flat in an outer circumference of a circular disk-shaped wafer by rotatively displacing said wafer about its axis relative to an optical sensor, said sensor being disposed slightly inside an arcuate portion of an outer circumference of said wafer;
   (b) defining a reference position of said wafer on the basis of the positions of respective ends of said major orientation flat;
   (c) gathering shape data of said wafer corresponding to angles of rotation of said wafer from said reference position by displacing said optical sensor relative to said wafer through at least one turn from said reference position; and
   (d) storing said shape data.

2. The method of claim 1, comprising attaching an adhesive tape to the wafer adjacent to the circumference thereof, and further comprising the step of guiding a cutting device to trim said adhesive tape away from said wafer based on the stored shape data.

3. A wafer shaped detecting method comprising:
   (a) rotating a circular disk-shaped wafer having a detectable non-uniformity in its outer circumference about the axis of said wafer, relative to an optical means, including a sensor and an emitter, emitting from said optical emitter a linear luminous flux of constant length in a plane perpendicular to said wafer along a radius of said wafer and extending outwardly beyond the outer circumference of said wafer;
   (b) sensing the amount of flux which passes the outer circumference of said wafer to provide shape data of said wafer corresponding to the angles of rotation of said wafer, whereby the contour of the outer circumferential edge of said wafer is determined by variations in said luminous flux caused by said non-uniformities; and
   (c) storing said shape data.

4. The method of claim 3, comprising attaching an adhesive tape to the wafer adjacent to the circumference thereof, and further comprising the step of guiding a cutting device to trim said adhesive tape away from said wafer based on the stored shape data.

5. A wafer shape detecting apparatus comprising: a swivel means for turning a disk-shaped wafer about the disk axis so as to rotate the wafer, said rotating wafer including a detectable change in shape comprised of a circumferential orientation flat or a notched portion, an optical means, including a sensor and an emitter for detecting the change in shape in the outer circumference of said wafer, said optical emitter including a means for emitting a linear luminous flux of constant length in a plane perpendicular to said wafer along a radius of said wafer and extending outwardly beyond the outer circumference of said wafer; and said optical sensor including a photoelectric element on the side of said disk opposite said emitting means for receiving said constant length luminous flux, whereby the shape of the outer circumference of said wafer is recognized in terms of a change in the amount of flux passing the circumference of the disk and being received by said optical sensor while turning said wafer, wherein the contour of said wafer is recognized by the data of the change in the line segment received by said photoelectric element.

6. An apparatus for trimming adhesive tape away from the outer circumference of a circular, disk-shaped wafer, comprising:
   (a) a suction bed having a flat upper surface and an elongated shaft, said suction bed being rotatable within a lift frame about the longitudinal axis of said shaft;
   (b) means for rotating said suction bed within said frame;
   (c) means for centering the wafer on the flat upper surface of said suction bed;
   (d) an optical sensing device having at least one light projector positioned above the plane of said wafer and at least one sensor positioned below the plane of said wafer, said projector and at least one sensor being disposed slightly inside of the arcuate portion of the outer circumference of said wafer; whereby a reference position for said wafer is defined by the position of a major orientation flat portion of the circumference of said wafer and the shape data of said wafer is generated by said optical sensing device in correspondence with the angle of rotation of the wafer from said reference position by rotating said wafer over at least one turn;
   (e) means for storing said shape data;
   (f) means for cutting said adhesive tape, and;
   (g) means for guiding said cutting means based on the stored shape data.

7. An apparatus as claimed in claim 6 wherein said rotating means is a step motor.

8. An apparatus as claimed in claim 7 wherein said rotating means is a DC servomotor.

9. An apparatus as claimed in claim 6, wherein said optical sensing device is positioned adjacent to the circumferential edge of said wafer, said device emits a linear luminous flux of constant length radially inward toward the center of the wafer and thereby irradiates the constant radial region of the outer circumferential edge of said wafer.

* * * * *